(12) United States Patent
Plevridis et al.

(10) Patent No.: US 7,869,782 B2
(45) Date of Patent: Jan. 11, 2011

(54) MULTI-MODE TRANSMIT AND RECEIVE PLL

(75) Inventors: Sofoklis E. Plevridis, Glyfada (GR); Konstantinos D. Vavelidis, Ilioupolis (GR); Theodoros Georgantas, Chaidari (FR); Ilias A. Bouras, Ilioupolis (GR)

(73) Assignee: Broadcom Corporation, Irvine, CA (US)

( * ) Notice: Subject to any disclaimer, the term of this patent is extended or adjusted under 35 U.S.C. 154(b) by 611 days.

(21) Appl. No.: 11/956,938

(22) Filed: Dec. 14, 2007

(65) Prior Publication Data

US 2009/0156149 A1 Jun. 18, 2009

(51) Int. Cl.
*H04B 1/06* (2006.01)

(52) U.S. Cl. .............. 455/260; 455/75; 455/552.1; 375/294

(58) Field of Classification Search ............ 455/73, 455/75, 84, 260, 552.1, 553.1; 375/294
See application file for complete search history.

(56) References Cited

U.S. PATENT DOCUMENTS

| | | | | |
|---|---|---|---|---|
| 5,448,763 A * | 9/1995 | Gillig | .................. | 455/260 |
| 5,566,204 A * | 10/1996 | Kardontchik et al. | ........ | 375/294 |
| 5,752,169 A * | 5/1998 | Hareyama et al. | ......... | 455/552.1 |
| 5,890,051 A * | 3/1999 | Schlang et al. | ........... | 455/552.1 |
| 6,421,530 B1 * | 7/2002 | Adachi et al. | ................ | 455/260 |

* cited by examiner

*Primary Examiner*—Quochien B Vuong
(74) *Attorney, Agent, or Firm*—Garlick Harrison & Markison

(57) ABSTRACT

A local oscillator (LO) signal generator that has a reference phase-locked loop (PLL), a receiver LO PLL and a transmitter LO PLL. A reference PLL is coupled to receive a reference clock input and to generate a reference PLL signal at its output, which then drives a receiver PLL and a transmitter PLL. The receiver PLL is coupled to receive the reference PLL signal and to use the reference PLL signal as its reference input to generate a receiver LO signal at its output. The transmitter PLL is coupled to receive the reference PLL signal and to use the reference PLL signal as its reference input to generate a transmitter LO signal at its output.

17 Claims, 3 Drawing Sheets

MULTI-MODE TRANSMIT AND RECEIVE PLL

BACKGROUND OF THE INVENTION

1. Technical Field of the Invention

The present invention relates generally to wireless communication systems and, more particularly, to phase-locked loops used in circuitry of wireless communication devices.

2. Description of Related Art

Mobile communication has changed the way people communicate and mobile phones have been transformed from a luxury item to an essential part of every day life. The use of mobile phones today is generally dictated by social situations, rather than being hampered by location or technology. While voice connections fulfill the basic need to communicate, and mobile voice connections continue to filter even further into the fabric of every day life, the mobile Internet and moving video, including broadcast video, are the next steps in the mobile communication revolution. The mobile Internet is poised to become a common source of everyday information, and easy, versatile mobile access to this data will be taken for granted. Similarly, video transmissions to handheld user equipment will allow movies and television programs to be viewed on the go.

Third generation (3G) cellular networks have been specifically designed to fulfill many, if not all, of these future demands. As these services grow in popularity and usage, factors such as cost efficient optimization of network capacity and quality of service (QoS) will become even more essential to cellular operators than it is today. These factors may be achieved with careful network planning and operation, improvements in transmission methods, and advances in receiver techniques. To this end, carriers want technologies that will allow them to increase downlink throughput and, in turn, offer advanced QoS capabilities and speeds that rival those delivered by cable modem and/or DSL service providers. In this regard, networks based on Code Division Multiple Access (CDMA) technology or Wideband Code Division Multiple Access (WCDMA) technology may make the delivery of data to end users a more feasible option for today's wireless carriers.

The General Packet Radio Service (GPRS) and Enhanced Data rates for GSM (EDGE) technologies may be utilized for enhancing the data throughput of present second generation (2G) systems such as GSM. The Global System for Mobile telecommunications (GSM) technology may support data rates of up to 14.4 kilobits per second (Kbps), while the GPRS technology may support data rates of up to 115 Kbps by allowing up to 8 data time slots per time division multiple access (TDMA) frame. The GSM technology, by contrast, may allow one data time slot per TDMA frame. The EDGE technology may support data rates of up to 384 Kbps. The EDGE technology may utilizes 8 phase shift keying (8-PSK) modulation for providing higher data rates than those that may be achieved by GPRS technology. The GPRS and EDGE technologies may be referred to as "2.5G" technologies.

The Universal Mobile Telecommunications System (UMTS) technology with theoretical data rates as high as 2 Mbps, is an adaptation of the WCDMA 3G system by GSM. One reason for the high data rates that may be achieved by UMTS technology stems from the 5 MHz WCDMA channel bandwidths versus the 200 KHz GSM channel bandwidths. The High Speed Downlink Packet Access (HSDPA) technology is an Internet protocol (IP) based service, oriented for data communications, which adapts WCDMA to support data transfer rates on the order of 10 megabits per second (Mbits/s). Developed by the 3G Partnership Project (3GPP) group, the HSDPA technology achieves higher data rates through a plurality of methods.

Where HSDPA is a downlink protocol, High Speed Uplink Packet Access (HSUPA) technology addresses the uplink communication. HSUPA is also specified by the 3GPP group to provide a complement data link to HSDPA. HSUPA also offers broadband IP and is based on software. HSUPA also extends the WCDMA bit rates, but the uplink rates may be less than the downlink rates of HSDPA. Where prior protocols severely limited the uplink connections, HSUPA allows for much higher uplink rates.

Likewise, standards for Digital Terrestrial Television Broadcasting (DTTB) provide for transmission of broadcast video. Three leading DTTB systems are the Advanced Television Systems Committee (ATSC) system, the Integrated Services Digital Broadcasting-Terrestrial (ISDB-T) system, and the Digital Video Broadcasting (DVB) system, which includes terrestrial transmission under Digital Video Broadcasting-Terrestrial (DVB-T) specifications and transmissions to handheld devices under Digital Video Broadcasting-Handheld (DVB-H) specifications. DVB-H is an adaptation of DVB-T to handheld units, in which additional features are implemented to meet specific requirements of handheld units. DVB-H allows downlink channels with high data rates and may be made as enhancements to current mobile wireless networks. DVB-H may use time slicing technology to reduce power consumption of handheld devices.

In order to practice the various protocols, a wireless communication device is utilized. For a wireless communication device to participate in wireless communications, it typically includes a built-in radio transceiver (i.e., receiver and transmitter) or is coupled to an associated radio transceiver (e.g., a station for in-home and/or in-building wireless communication networks, RF modem, etc.). The transmitter typically includes a data modulation stage, one or more intermediate frequency stages, and a power amplifier. The data modulation stage converts raw data into baseband signals in accordance with a particular wireless communication standard. The one or more intermediate frequency stages mix the baseband signals with a local oscillator signal to produce radio frequency (RF) signals. The power amplifier amplifies the RF signals prior to transmission via an antenna.

The receiver is coupled to an antenna and typically includes a low noise amplifier, one or more intermediate frequency stages, a filtering stage, and a data recovery stage. The low noise amplifier receives inbound RF signals via the antenna and amplifies them. The one or more intermediate frequency stages mix the amplified RF signals with a local oscillator signal to convert the amplified RF signal into baseband signals or intermediate frequency (IF) signals. The filtering stage filters the baseband signals or the IF signals to attenuate unwanted out of band signals to produce filtered signals. The data recovery stage recovers raw data from the filtered signals in accordance with the particular wireless communication standard.

One of the components in a typical RF front end is the local oscillator that generates a local oscillator signal that is sent to a mixer to mix the inbound RF signal for down-conversion and/or to mix the outbound signal in the transmitter for up-conversion to a RF signal for transmission. A common technique is to utilize a phase-locked loop (PLL) circuitry for generating the local oscillator signal. PLL circuits implement a closed loop phase or frequency control system that looks at the input and output of the PLL and uses a difference signal to correct for variations at the output. In this manner, a PLL may provide a stable local oscillator signal at its output.

When a wireless communication device includes both a transmitter and a receiver resident thereon, separate RF mixers are used on the receive side and the transmit side. The local oscillator (LO), such as the above-mentioned PLL, provides the LO signal to the mixers for up-conversion or down-conversion. With both a transmitter and a receiver, one practice is to use a single PLL that generates LO signal(s) for both transmit and receive frequency conversion. Disadvantage are noted for a single PLL generating both receive and transmit LO signals. For example, the use of one reference frequency (e.g. crystal reference) limits the available frequencies for both the transmit and receive sides. Where transmit and receive LO frequencies are the same or close to each other, a single PLL may suffice. However, if the transmit and receive LO signals are significantly apart, then it may be difficult to obtain both frequencies from a single PLL source. Additionally, if multiple frequencies are being generated from a single PLL, there may be limitations placed on the switching speed when frequencies are to be changed.

In order to circumvent the disadvantages imposed by a single PLL design, another technique uses two separate PLLs; one for the transmit side and the second for the receive side. A transmit PLL provides a transmit LO signal to the transmitter mixer and a receive PLL provides a receive LO signal to the receiver mixer. In this manner separate LO frequencies may be generated for the receiver and the transmitter. However, with the use of two PLLs, there is still the problem of the first PLL not tracking with the second PLL or, alternatively, where the second PLL is dependent on the first, independent operation (such as frequency selection or switching) between the two PLLs is difficult to achieve.

For example, when multiple RF frequencies are to be converted in the receiver mixer or generated in the transmitter mixer, the LO frequencies from the PLL most likely needs to switch rapidly. Thus, for higher frequency devices, PLL switching speed should not be a limitation. Prior art PLL circuitry may not have the capability to perform the switching operation and maintain the stability in the LO signals. Further, when transmitters and receivers have different frequency requirements, independence in selection of receive side LO and transmitter side LO is useful.

Therefore, a need exists for a technique to implement a robust PLL circuitry for use as a local oscillator to generate both transmit and receive LO signals that are independent of each other, but still operate together to track variations in the reference input.

SUMMARY OF THE INVENTION

The present invention is directed to apparatus and methods of operation that are further described in the following Brief Description of the Drawings, the Detailed Description of the Embodiments of the Invention, and the Claims. Other features and advantages of the present invention will become apparent from the following detailed description of the embodiments of the invention made with reference to the accompanying drawings.

DETAILED DESCRIPTION OF THE EMBODIMENTS OF THE INVENTION

The embodiments of the present invention may be practiced in a variety of settings that utilize a wireless communication transceiver. The specific embodiments described below pertain to a PLL structure used at a RF front-end of a wireless device. However, the invention need not be limited to such applications and different embodiments of the invention may be implemented in other circuitry and applications. For example, embodiments of the invention may be readily implemented in a downlink device, as well as in an uplink device.

Figure 1:
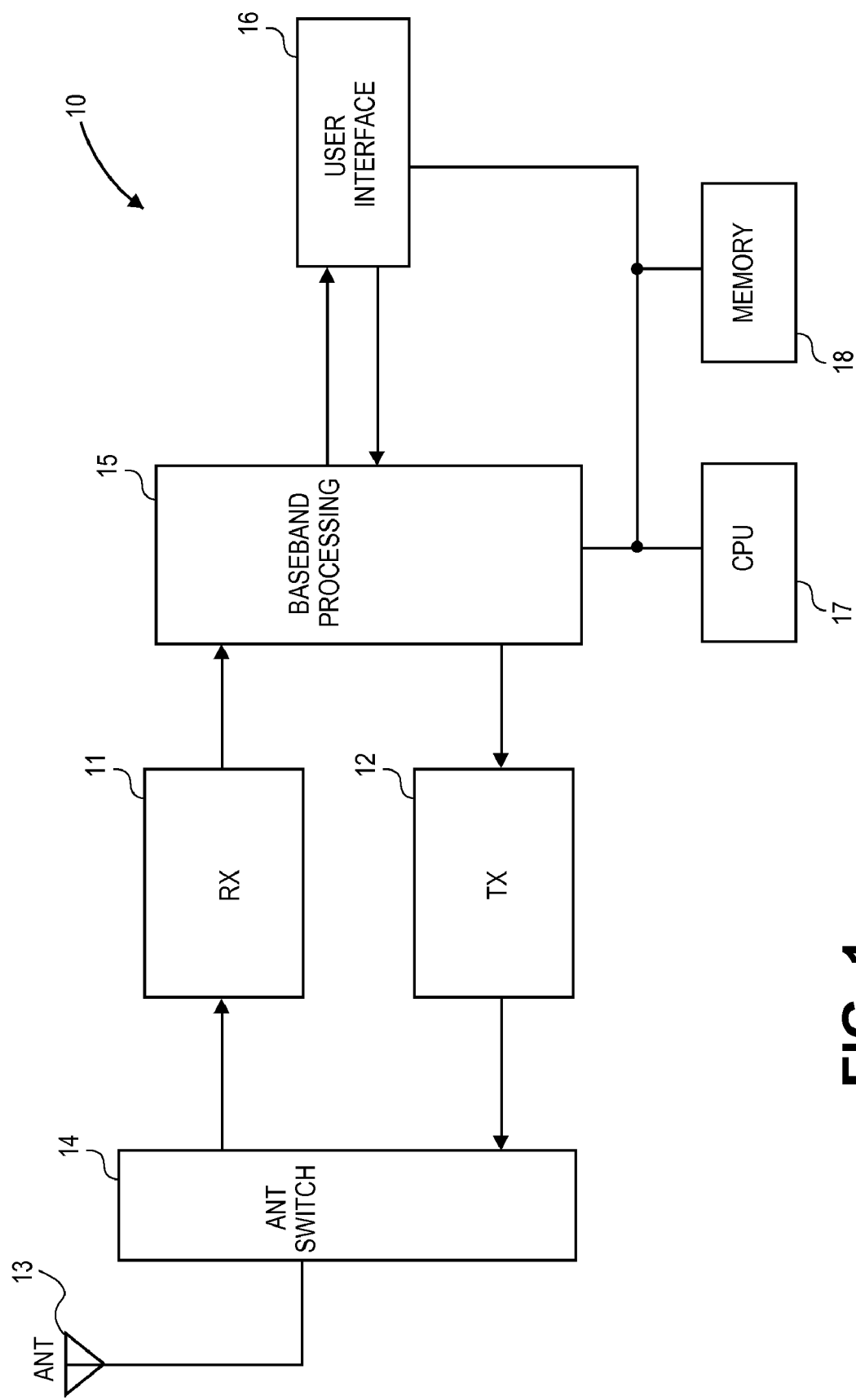
FIG. 1 is a block diagram showing an exemplary downlink device used in a wireless communication system.

FIG. 1 shows a wireless device 10 which is used in a wireless communication system. Device 10 may be of a variety of wireless devices for sending and receiving data. As such, device 10 may be a computing device, a routing device, a communication device, etc. In one instance, device 10 may be used as a user terminal or user equipment (UE) for communicating with an uplink device. Device 10 may be a cell phone for receiving and sending audio communication and/or text messaging. Device 10 may also send and receive packet traffic for communications through the Internet, or some other network. Device 10 may also send and/or receive video data. In other instances, device 10 may receive moving video and/or broadcast transmissions, such as broadcast television. Device 10 may be a computer, such as a desktop computing unit or a laptop computing unit. What is to be noted is that device 10 may operate to receive a variety of signals transmitted from another device and the received signal depends on the particular environment of the communication system that device 10 operates in. Furthermore, device 10 may transmit signals to another device. In one embodiment, device 10 may be a downlink device, such as a cell phone or some other handheld device that is operated by a user.

Device 10 includes a receiver (RX) 11 and transmitter (TX) 12 which are coupled to an antenna 13, via switch 14. Switch 14 may take many forms and may implement different radio frequency (RF) switching technology. Switch 14 may include transmit/receive (T/R) switching circuitry and/or duplexers, etc. What is to be noted is that some form of switching and/or duplexing may be implemented between antenna 13 and the RF front end of device 10. In some instances antenna 13 may comprise multiple antennas. Receiver 11 includes suitable circuitry to receive and convert inbound RF signals to inbound baseband signals. Likewise, transmitter 12 includes suitable circuitry to convert outbound baseband transmit signals to outbound RF signals for transmission from antenna 13.

Device 10 also includes a baseband processing module 15 and user interface 16. Baseband processing module 15 is coupled to receiver 11 to process the converted inbound signals from receiver 11 and to provide an output to the user of the device through interface 16. Similarly, user inputs at interface 16 are coupled to baseband processing module 15 and outbound signals for transmission are coupled to transmitter 12. User interface 16 may take various forms including, but not limited to, a video display, keyboard, microphone, headphones and/or speakers. Baseband processing module generally performs baseband operations in signal processing for received signals and likewise for signals to be transmitted.

Device 10 may also include a general (or host) processor 17 to control various processing operations of device 10, including control functions for interface 16 and baseband processing module 15. Processor 17, in some applications, is referred to as a Central Processing Unit (CPU). A memory component 18, which may be an internal memory or an add-on memory, may be included to operate with processor 17. It is to be noted that a variety of storage devices may be implemented for memory 18. Processor 17 is shown coupled to baseband processing module 15 and user interface 16, but other connections are possible to various components of device 10 in other embodiments.

As noted above, device 10 is a wireless device and in one embodiment, device 10 operates as a downlink transceiver for receiving and sending communication signals. In one embodiment, device 10 is operated as a handheld terminal in a communication link. In particular, device 10 may operate within a cellular environment. Although a variety of receivers and transmitters (transceivers) may be implemented for RX 11 and TX 12, one particular embodiment is illustrated in FIG. 2.

Figure 2:
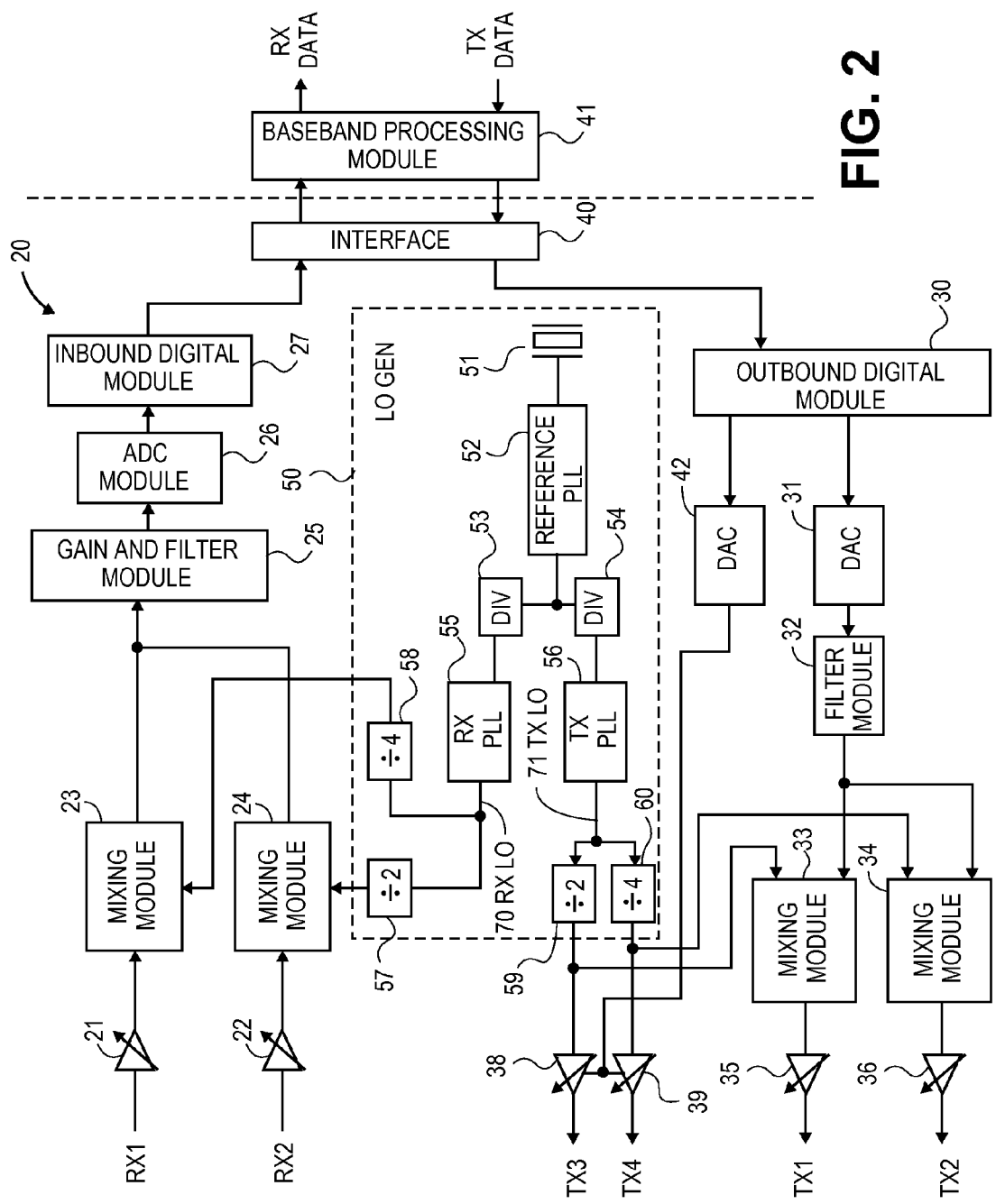
FIG. 2 is a block schematic diagram of an exemplary RF front-end of a wireless device that implements an embodiment of a PLL circuit of the present invention.

FIG. 2 shows a single-chip multiple-band RF transceiver that may be implemented in a RF front-end of a variety of wireless devices, including device 10 of FIG. 1. In one embodiment, transceiver stage 20 is constructed on a single integrated circuit (IC). A baseband interface 40 couples the transceiver stage to a baseband processing module 41. Baseband processing module 41 may be utilized for baseband processing module 15 of FIG. 1. Furthermore, baseband processing module 41 may be constructed on the same IC as transceiver stage 20. Alternatively, baseband processing module 41 may be constructed on a separate IC.

The receiver side of transceiver stage 20 includes a first low-noise amplifier (LNA) module 21, second LNA module 22, first receiver mixing module 23, second receiver mixing module 24, gain and filter module 25, analog-to-digital conversion (ADC) 26 and inbound digital module 27. The transmitter side of transceiver stage 20 includes an outbound digital module 30, first digital-to-analog converter (DAC) 31, a second DAC 42, filter module 32, first transmitter mixing module 33, second transmitter mixing module 34, first power amplifier (PA) module 35, second PA module 36, third PA module 38 and fourth PA module 39. It is to be noted that any or all of PA modules 35, 36, 38, 39 may be the power amplifier itself or a driver that drives a power amplifier that resides off-chip. Further, it is to be noted that although a specific number of LNA modules and PA modules are noted, there may be more such units in other embodiments, while in other embodiments there may only be one LNA and/or PA. Furthermore, LNA modules are hereinafter simply referred to as LNAs and PA modules are simply referred to as PAs.

In the particular embodiment of FIG. 2, multiple LNAs are used so that each LNA 21, 22 operates on a selected set or band of receiving frequencies. Similarly, multiple PAs are used so that each PA (or PA driver) operates on a selected set or band of transmitting frequencies. Thus, inbound RF input to LNA 21 is designated as RX1 and RF input to LNA 22 is designated as RX2. RX1 and/or RX2 may each be a single band or multiple band of frequencies. Outbound RF signals for transmission are noted as TX1, TX2, TX3 and TX4, which correspond to outputs from PAs 35, 36, 38, 39, respectively.

Although the range of frequencies operated on by each LNA varies from embodiment to embodiment, in one implementation, LNA 21 accepts one set of signals within a frequency band that is at approximately 800 MHz and accepts a second set of signals within a frequency band that is at approximately 900 MHz. Also with this embodiment, LNA 22 accepts signals within three separate frequency bands, where the bands are noted at approximately 1800 MHz, 1900 MHz and 2100 MHz.

It is to be noted that some frequency bands may be set standards and a given band may be identified by a single frequency. For example, a frequency band at 800 MHz may actually refer to frequencies in a range of 830-840 MHz. Likewise, a frequency band at 900 MHz may actually refer to frequencies in a range of 880-915 MHz or 925-960 MHz. Some of the frequency ranges may depend on whether the communication of the particular band is uplink communication or downlink communication. Typically, these frequency bands define a range of frequencies for a particular communication protocol that is being used The PAs also operate in a like manner, in which each operates to transmit signals in one or more band of frequencies. Thus, in the described example embodiment, PA 38 outputs signals within two separate frequency bands, where a first band is at approximately 1800 MHz and a second band is at approximately 1900 MHz. PA 39 is used to output signals within two separate frequency bands, where the one band is at approximately 850 MHz and the other band is at approximately 900 MHz. Likewise, PA 36 outputs signals within two frequency bands, where one band is at approximately 850 MHz and the other band is at approximately 900 MHz. PA 35 outputs signals within three frequency bands, where a first band is at approximately 1800 MHz, a second band is at approximately 1900 MHz and a third band is at approximately 2100 MHz. As noted above, these frequency bands define a range of frequencies for a particular communication protocol that is being used. Furthermore, in one embodiment, PAs 38, 39 are operable for GSM/EDGE signal transmissions, while PAs 35, 36 are operable for WCDMA transmissions. It is to be noted that other embodiments may have different frequency band schemes and those described herein are examples of particular embodiments of the invention.

Although not shown in detail, it is to be noted that the antenna circuitry, as noted by antenna 13 and antenna switch 14 in FIG. 1, may be comprised of one or more antennas, duplexers, switches, transmission lines, transformer baluns, impedance matching networks, filters (such as a Surface Acoustic Wave or SAW filter) and/or tuners to operate on and transfer the various band(s) of received signals from the antenna(s) to the appropriate LNA and transfer the various PA output signals to the antenna(s) for transmission. Furthermore, the signals may take various forms, including but not limited to GSM, EDGE, CDMA, WCDMA, GMSK (Gaussian Minimum-Shift Keying), 2-GMSK, 4-GMSK, 8-PSK (Phase-Shift Keying), MSK (Minimum-Shift Keying), FSK (Frequency-Shift Keying), ASK (Amplitude-Shift Keying), QPSK (Quadrature Phase-Shift Keying), QAM (Quadrature Amplitude-Shift Keying), BPSK (Binary Phase-Shift Keying) and 8-PSK, just to name a few.

The received signal RX1 is amplified by LNA 21 and down-converted in mixing module 23. Likewise, the received signal RX2 is amplified by LNA 22 and down-converted in mixing module 24. The outputs of the two receiver mixing modules 23, 24 are coupled to gain and filter module 25 for gain adjustment and filtering of the signal and subsequently converted to digital format in ADC module 26. It is to be noted that although one receive path is shown in FIG. 2 between the modules, in actuality separate paths exists for the in-phase (I) component and the quadrature (Q) component. The I and Q outputs from ADC module 26 are coupled to inbound digital module 27, which provides further processing prior to coupling the received signals to baseband processing module 41, via interface 40. The receive output from baseband processing module is shown as RX DATA. Additionally, it is to be noted that inputs and outputs from various components on the receive path may be single-ended or differential.

The transmitter side operates in reverse. Baseband processing module 41 receives TX DATA and provides the baseband processing. The outbound signal which is to be converted and transmitted is sent to outbound digital module 30 via interface 40. Although other embodiments may have different transmitting paths, in this particular embodiment, one set of signals are sent to PAs 38, 39 via DAC 42 to generate TX3 and/or TX4. A second set of signals are sent to PAs 35, 36 via DAC 31 to generate TX1 and/or TX2. This second path utilizes a filter module 32 to filter the analog signal out of DAC 31 and the output of filter module 32 is coupled to mixing modules 33, 34, depending on the frequency of the output. The output of mixing module 33 is coupled to PA 35 to output TX1 and output of mixing module 34 is coupled to PA 36 to output TX2. As noted above, although one line is shown in FIG. 2 between the modules in each transmitting path, in actuality separate paths exist for the I and Q components from inbound digital module 30 to PAs 35, 36. Furthermore, as noted above, the particular embodiment shown is operable to transmit TX3 and TX4 signals as GSM/EDGE signal transmissions, while TX1 and TX2 signals are WCDMA transmissions. Additionally, it is to be noted that inputs and outputs from various components on the transmit path may be single-ended or differential.

Furthermore, it is to be noted that baseband processing module 41 may perform a variety of processing at the baseband level, including but not limited to one or more of scrambling, encoding, constellation mapping, modulation, frequency spreading, frequency hopping, beamforming, space-time-block encoding, space-frequency-block encoding, and/or digital baseband to IF conversion to convert the outbound signal. Depending on the desired formatting of the outbound signal, the baseband processing module 41 may generate the outbound signal as Cartesian coordinates (e.g., having an in-phase signal component and a quadrature signal component to represent a symbol), as Polar coordinates (e.g., having a phase component and an amplitude component to represent a symbol), or as hybrid coordinates.

In addition, it is to be noted that baseband processing module 41 also converts the inbound signal by performing a variety of processing at the baseband level, including but not limited to, one or more of descrambling, decoding, constellation demapping, modulation, frequency spreading decoding, frequency hopping decoding, beamforming decoding, space-time-block decoding, space-frequency-block decoding, and/or IF to digital baseband conversion to convert the inbound signal.

In order to generate local oscillator signals for performing signal conversion, transceiver stage 20 also includes a local oscillator generator module (LO GEN) 50. LO GEN 50 includes a reference clock source, which in this example embodiment is a reference crystal 51. Crystal 51 operates as a clock reference and a particular clock frequency is selected for the reference clock for LO GEN 50. This reference clock is input to a reference input of a reference PLL 52. PLL 52 is utilized strictly to generate a reference PLL signal.

An output of reference PLL 52 is coupled to two other PLLs, one noted as receiver (RX) PLL 55 and the other as transmitter (TX) PLL 56, via dividers 53 and 54, respectively. Divider 53 divides the reference PLL output from PLL 52 and the divided reference PLL output is coupled as a reference input to RX PLL 55. Similarly, divider 54 divides the reference PLL output from PLL 52 and this divided reference PLL output is coupled as a reference input to TX PLL 56. Subsequently, PLL output from RX PLL 55 provides a receiver local oscillator (RX LO) signal 70 and this RX LO signal is coupled through divider 57 and then to mixing module 24 as a first divided RX LO signal. The RX LO signal is also coupled through divider 58 and then to mixing module 23 as a second divided RX LO signal. In the particular embodiment shown, divider 57 is a divide-by-two (÷2) divider, while divider 58 is a divide-by-four (÷4) divider.

Likewise, PLL output from TX PLL 56 provides a transmitter local oscillator (TX LO) signal 71 and this TX LO signal is coupled through divider 59 to generate a first divided TX LO signal. TX LO signal is also coupled through divider 60 to generate a second divided TX LO signal. The first divided TX LO signal is coupled to mixing module 33 and PA 38, while the second divided TX LO signal is coupled to mixing module 34 and PA 39. In the particular embodiment shown, divider 59 is a divide-by-two (÷2) divider, while divider 60 is a divide-by-four (÷4) divider.

It is to be noted that the particular embodiment of FIG. 2 shows two pairs of PAs. PAs 38, and 39 receive one set of outbound signals after being converted to digital format by DAC 42. This is an amplitude component (AM) signal that is modulated with the divided TX LO signal in PAs 38, 39. In one embodiment, this technique is used to generate outbound RF signals for GSM/EDGE communication protocol. The divided TX LO signals are also provided to mixing modules 33, 34 for direct conversion of another set of outbound signals in which the LO signals are modulated by the outbound signal. In one embodiment, this technique is used to generate outbound RF signals for WCDMA communication protocol.

Figure 3:
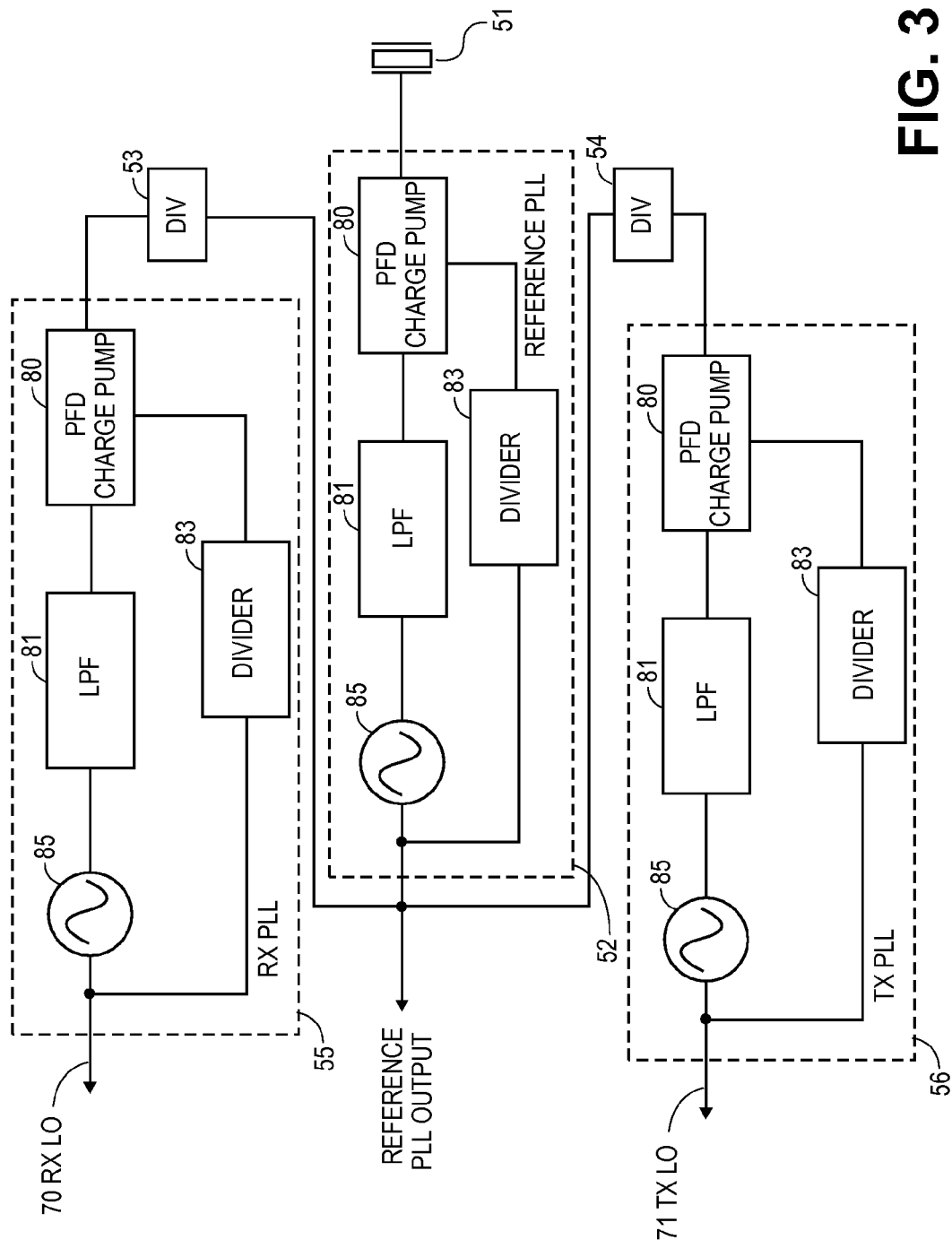
FIG. 3 is a block schematic diagram showing one embodiment of the PLL circuit of FIG. 2, in which three PLLs are used to independently generate at least one transmit LO signal and at least one receive LO signal.

FIG. 3 shows a more detailed schematic diagram for the three PLL structure of LO GEN 50. Each PLL 52, 55, 56 is comprised of four main components. Each PLL has an input (commonly referred to as a reference input) and an output. In a typical PLL operation, the output of the PLL is feedback to the input and the two frequencies are compared to generate an error (correction) signal that is a measure of their phase difference. This error signal is then used to adjust the output to the correct frequency. Thus, for each of the PLLs of FIG. 3, a reference input is coupled to a phase/frequency detector (PFD)-charge pump module 80 to measure the phase difference of the two inputs and generate an error signal. A low-pass filter module 81 is used to filter the error signal, which is then coupled to a voltage controlled oscillator (VCO) module 85 to adjust the VCO output. Aside from providing an output from the PLL, the VCO output is fed back to PFD-charge pump module 80. In some instances, a divider 83 is placed in the feedback loop to scale the feedback frequency.

As shown in FIGS. 2 and 3, reference PLL 52 is coupled to crystal reference 51, which sets the reference clock frequency of PLL 52. The output of PLL 52 is then coupled to the reference input of RX PLL 55, as well as to the reference input of TX PLL 56. RX PLL 55 is used to output RX LO signal 70 and TX PLL 56 is used to output TX LO signal 71. In the particular embodiment shown, a divider 53 is used to divide the frequency of the reference PLL output before it is coupled to the input of RX PLL 55. Likewise, a divider 54 is used to divide the frequency of the reference PLL output before it is coupled to the input of TX PLL 56. In some embodiments, one or both of these dividers may not be present. Furthermore, one or both of the frequency dividers may have their divisors set to a fixed value, but in other embodiments the dividers may be programmed to adjust the divisor value(s), so that the frequency division may be adjusted and/or switched.

As noted in FIG. 2, RX LO is sent to mixing modules 23, 24, via dividers 58, 57, respectively. Here, dividers 57, 58 are shown to have fixed divisors (÷2 and ÷4), but these dividers may be made programmable to change the divisor value in other embodiments. Likewise, TX LO is sent to PA 38 and mixing module 33 via divider 59, which has a divisor value of two, and TX LO is sent to PA 39 and mixing module 34 via divider 60, which has a divisor value of four. Here again, dividers 59, 60 are shown to have fixed divisors, but these dividers may be made programmable to change the divisor value in other embodiments. The various dividers with either set or programmble divisor values allow for various LO frequencies to be selected, depending on the frequency of the inbound signal and/or the frequency of the outbound signal.

As shown in the drawings, the three PLL scheme allows for one separate PLL to be used as a reference PLL (PLL 52). The output of this reference PLL is then used to independently drive the receiver PLL (RX PLL 55) and the transmitter PLL (TX PLL 56). Since the reference PLL is used as a driver, the reference PLL may have a high output frequency, which is suitable for third generation (3G), or even higher generation (such as 4G), cellular phones. The two main PLLs 55, 56, may also operate at the higher frequencies, but now the LO frequencies for the receiver and the transmitter may be selected independently of one another. However, because the two main PLLs are driven by the same reference PLL, both PLLs 55, 56 may track to any variations in the reference PLL output. Furthermore, in some embodiments, the TX PLL may be turned off (or put in low-power state) during non-transmit periods and/or the RX PLL may be turned off (or put in low-power state) during non-receive periods. The placing of one or both PLLs in the turn-off, inactive, or low-power state allows power management control of LO GEN 50 to conserve power.

Accordingly, a multi-mode transmit and receive PLL is described.

As may be used herein, the terms "substantially" and "approximately" provides an industry-accepted tolerance for its corresponding term and/or relativity between items. Such an industry-accepted tolerance ranges from less than one percent to fifty percent and corresponds to, but is not limited to, component values, integrated circuit process variations, temperature variations, rise and fall times, and/or thermal noise. Such relativity between items ranges from a difference of a few percent to magnitude differences. As may also be used herein, the term(s) "coupled" and/or "coupling" includes direct coupling between items and/or indirect coupling between items via an intervening item (e.g., an item includes, but is not limited to, a component, an element, a circuit, and/or a module) where, for indirect coupling, the intervening item does not modify the information of a signal but may adjust its current level, voltage level, and/or power level. As may further be used herein, inferred coupling (i.e., where one element is coupled to another element by inference) includes direct and indirect coupling between two items in the same manner as "coupled to". As may even further be used herein, the term "operable to" indicates that an item includes one or more of power connections, input(s), output (s), etc., to perform one or more its corresponding functions and may further include inferred coupling to one or more other items.

Furthermore, the term "module" is used herein to describe a functional block and may represent hardware, software, firmware, etc., without limitation to its structure. A "module" may be a circuit, integrated circuit chip or chips, assembly or other component configurations. Accordingly, a "processing module" may be a single processing device or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on hard coding of the circuitry and/or operational instructions and such processing device may have accompanying memory. A "module" may also be software or software operating in conjunction with hardware.

The embodiments of the present invention have been described above with the aid of functional building blocks illustrating the performance of certain functions. The boundaries of these functional building blocks have been arbitrarily defined for convenience of description. Alternate boundaries could be defined as long as the certain functions are appropriately performed. One of ordinary skill in the art may also recognize that the functional building blocks, and other illustrative blocks, modules and components herein, may be implemented as illustrated or by discrete components, application specific integrated circuits, processors executing appropriate software and the like or any combination thereof.

We claim:

1. An apparatus comprising:
   a first phase-locked loop (PLL) coupled to receive a reference input and to generate a reference PLL signal at its output;
   a second PLL coupled to receive the reference PLL signal from the first PLL and to use the reference PLL signal as its reference input to generate a receiver local oscillator (LO) signal at its output; and
   a third PLL coupled to receive the reference PLL signal from the first PLL and to use the reference PLL signal as its reference input to generate a transmitter LO signal at its output, the transmitter LO signal being generated separate from the receiver LO signal and the two LO signals being not dependent on each other.

2. The apparatus of claim 1, wherein the first PLL operates as a driver to drive the second and third PLLs.

3. The apparatus of claim 2, wherein a frequency of operation for the second PLL is selectable independent from selecting a frequency of operation for the third PLL.

4. The apparatus of claim 2, wherein a frequency of operation for the third PLL is selectable independent from selecting a frequency of operation for the second PLL.

5. The apparatus of claim 2, wherein the second PLL is switched into a power saving mode when not in a receive mode of operation.

6. The apparatus of claim 2, wherein the third PLL is switched into a power saving mode when not in a transmit mode of operation.

7. An apparatus comprising:
   an radio frequency (RF) front end including a receiver to receive an inbound signal and a transmitter to transmit an outbound signal, wherein the receiver includes at least one receiver mixing module to mix the inbound signal with a receiver local oscillator (RX LO) signal and wherein the transmitter includes at least one transmitter mixing module to mix the outbound signal with a transmitter local oscillator (TX LO) signal;
   a local oscillator coupled to the receiver and the transmitter in which the local oscillator includes:
   (a) a first phase-locked loop (PLL) that is coupled to receive a reference input and to generate a reference PLL signal at its output;
   (b) a second PLL coupled to receive the reference PLL signal from the first PLL and to use the reference PLL signal as its reference input to generate the RX LO signal at its output; and
   (c) a third PLL coupled to receive the reference PLL signal from the first PLL and to use the reference PLL signal as its reference input to generate the TX LO signal at its output, the TX LO signal being generated separate from the RX LO signal and the two LO signals being not dependent on each other.

8. The apparatus of claim 7, wherein the first PLL operates as a driver to drive the second and third PLLs.

9. The apparatus of claim 8, wherein the local oscillator further includes a first divider coupled between the first PLL and the reference input of the second PLL to provide a frequency division of the reference PLL signal coupled to the second PLL and a second divider coupled between the first PLL and the reference input of the third PLL to provide a frequency division of the reference PLL signal coupled to the third PLL.

10. The apparatus of claim 9, wherein the local oscillator further includes a third divider and a fourth divider, in which the third divider divides the RX LO signal that is coupled to a first receiver mixer and the fourth divider divides the RX LO signal that is coupled to a second receiver mixer.

11. The apparatus of claim 10, wherein the local oscillator further includes a fifth divider and a sixth divider, in which the fifth divider divides the TX LO signal that is coupled to a first transmitter mixer and the sixth divider divides the TX LO signal that is coupled to a second transmitter mixer.

12. The apparatus of claim 11, wherein one or more of the dividers is programmable to change a divider value.

13. The apparatus of claim 8, wherein a frequency of operation for the second PLL is selectable independent from selecting a frequency of operation for the third PLL.

14. The apparatus of claim 13, wherein the second PLL and the third PLL are switched into a power saving mode when not in a respective receive or transmit mode of operation.

15. A method comprising:
generating a reference PLL signal at an output of a first phase-locked loop (PLL) that is coupled to receive a reference input;
generating a receiver local oscillator (LO) signal at an output of a second PLL that is coupled to receive the reference PLL signal from the first PLL and to use the reference PLL signal as its reference input to generate the receiver LO signal; and
generating a transmitter LO signal at an output of a third PLL that is coupled to receive the reference PLL signal from the first PLL and to use the reference PLL signal as its reference input to generate the transmitter LO signal, the transmitter LO signal being generated separate from the receiver LO signal and the two LO signals being not dependent on each other.

16. The method of claim 15, wherein generating the reference PLL signal includes generating the first PLL signal to operate as a driver signal to drive the second and third PLLs, in which a frequency of operation for the second PLL is selectable independent from selecting a frequency of operation for the third PLL.

17. The method claim 16, further including mixing an inbound signal with the receiver LO signal and mixing an outbound signal with the transmitter LO signal.

* * * * *